(12) United States Patent
Bruce et al.

(10) Patent No.: US 10,903,270 B2
(45) Date of Patent: Jan. 26, 2021

(54) ACCESS DEVICE AND PHASE CHANGE MEMORY COMBINATION STRUCTURE IN BACKEND OF LINE (BEOL)

(71) Applicant: International Business Machines Corporation, Armonk, NY (US)

(72) Inventors: Robert Bruce, White Plains, NY (US); Fabio Carta, Yorktown Heights, NY (US); Gloria WingYun Fraczak, Queens, NY (US); Hiroyuki Miyazoe, White Plains, NY (US); Kumar R. Virwani, Santa Clara, CA (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/227,091

(22) Filed: Dec. 20, 2018

(65) Prior Publication Data
US 2019/0123101 A1 Apr. 25, 2019

Related U.S. Application Data

(62) Division of application No. 15/784,343, filed on Oct. 16, 2017.

(51) Int. Cl.
*H01L 45/00* (2006.01)
*H01L 27/24* (2006.01)

(52) U.S. Cl.
CPC ...... *H01L 27/2418* (2013.01); *H01L 27/2409* (2013.01); *H01L 27/2481* (2013.01); *H01L 45/06* (2013.01); *H01L 45/085* (2013.01); *H01L 45/1233* (2013.01); *H01L 45/1253* (2013.01); *H01L 45/1675* (2013.01); *H01L 45/1683* (2013.01)

(58) Field of Classification Search
CPC ............. H01L 27/2418; H01L 27/2409; H01L 45/1683; H01L 45/085; H01L 27/2481; H01L 45/1233; H01L 45/06; H01L 45/1253; H01L 45/1675
See application file for complete search history.

(56) References Cited

U.S. PATENT DOCUMENTS

| 10,096,773 | B1* | 10/2018 | Ando | G06N 3/04 |
| 10,600,656 | B2* | 3/2020 | Joseph | H01L 21/76886 |
| 2007/0096248 | A1* | 5/2007 | Philipp | H01L 45/1226 257/528 |
| 2007/0279974 | A1* | 12/2007 | Dennison | G11C 13/0004 365/163 |

(Continued)

OTHER PUBLICATIONS

List of IBM Patents or Applications Treated as Related, 2018.

*Primary Examiner* — Bitew A Dinke
(74) *Attorney, Agent, or Firm* — Garg Law Firm, PLLC; Rakesh Garg; Randall Bluestone

(57) ABSTRACT

A combined semiconductor device is fabricated by forming a first access structure from a mixed ionic electronic conduction (MIEC) material. A first side of a first memory structure is electrically coupled with a first side of the first access structure to form the combination device. A subtractive etching process is applied to the combination device such that a surface of the combination device that is substantially orthogonal to a plane of a substrate of the semiconductor device is within a defined tapering tolerance.

9 Claims, 18 Drawing Sheets

(56) References Cited

U.S. PATENT DOCUMENTS

| | | | |
|---|---|---|---|
| 2008/0121862 A1* | 5/2008 | Liu | G11C 13/0004 257/4 |
| 2008/0315359 A1* | 12/2008 | Happ | H01L 27/24 257/537 |
| 2009/0230376 A1* | 9/2009 | Ryoo | H01L 27/2409 257/2 |
| 2009/0230505 A1* | 9/2009 | Dennison | H01L 45/06 257/522 |
| 2009/0231911 A1* | 9/2009 | Liu | H01L 45/06 365/163 |
| 2009/0242865 A1* | 10/2009 | Lung | H01L 27/24 257/2 |
| 2009/0289242 A1* | 11/2009 | Breitwisch | H01L 45/06 257/2 |
| 2010/0181649 A1* | 7/2010 | Lung | H01L 27/1026 257/588 |
| 2010/0227449 A1* | 9/2010 | Kim | H01L 27/1021 438/382 |
| 2011/0095257 A1* | 4/2011 | Xu | H01L 21/32139 257/3 |
| 2012/0068136 A1* | 3/2012 | Park | H01L 45/06 257/1 |
| 2012/0235109 A1* | 9/2012 | Nojiri | H01L 27/2409 257/4 |
| 2012/0322223 A1* | 12/2012 | Oh | H01L 45/06 438/382 |
| 2014/0187047 A1* | 7/2014 | Tagami | H01L 21/31144 438/703 |
| 2015/0243708 A1* | 8/2015 | Ravasio | H01L 45/1233 257/4 |
| 2015/0243709 A1* | 8/2015 | Song | H01L 21/0337 257/4 |
| 2017/0213870 A1* | 7/2017 | Sim | H01L 45/144 |
| 2017/0243918 A1* | 8/2017 | Terai | H01L 27/2427 |
| 2017/0243919 A1* | 8/2017 | Seong | H01L 45/1233 |
| 2017/0244030 A1* | 8/2017 | Park | H01L 45/1675 |
| 2017/0244031 A1* | 8/2017 | Jeong | H01L 27/2481 |
| 2017/0250339 A1* | 8/2017 | Sim | H01L 45/1233 |
| 2017/0271592 A1* | 9/2017 | Lee | H01L 27/2427 |
| 2018/0006219 A1* | 1/2018 | Seo | H01L 45/1253 |
| 2018/0040669 A1* | 2/2018 | Wu | H01L 23/528 |
| 2018/0040819 A1* | 2/2018 | Fraczak | H01L 45/1233 |
| 2018/0175109 A1* | 6/2018 | Choi | G11C 13/0004 |
| 2018/0287055 A1* | 10/2018 | Park | H01L 45/06 365/163 |
| 2019/0123100 A1* | 4/2019 | Bruce | H01L 27/2409 |

* cited by examiner

ACCESS DEVICE AND PHASE CHANGE MEMORY COMBINATION STRUCTURE IN BACKEND OF LINE (BEOL)

TECHNICAL FIELD

The present invention relates generally to a method, system, and computer program product for fabricating compute-in-memory capable semiconductor devices. More particularly, the present invention relates to a method, system, and computer program product for access device and phase-change memory combination structure.

BACKGROUND

Within the scope of the illustrative embodiments—
(a) A Memory Element: Refers to an element that is used to store data/information. Many options exist here (including, for example, phase change memory (PCM), MRAM, Resistive RAM, solid electrolyte memory, FeRAM, etc.), with one promising memory node material being PCM.
(b) A Rectifying Element or Access Device (AD): Since a transistor is not provided at every crosspoint, a device is needed to rectify (exhibit nonlinearity). This ensures that the memory cells that lie on unselected wordlines and bitlines are not inadvertently programmed or shorted to each other and do not leak any significant amount of current.

A variety of diodes can be used for rectification. The illustrative embodiments recognize that the quality of the diodes that can be fabricated in middle-of-line (MOL) or back end of line (BEOL) lower temperature processes are typically unacceptable because they have to be made in amorphous or polycrystalline silicon that has much lower mobility. These considerations prevent the use of p-n junctions in either single-crystal silicon or other silicon materials as rectifiers for certain memory elements.

The von Neumann bottleneck is a limitation on throughput caused by the standard personal computer architecture— the stored program computer—which is also known as the von Neumann architecture. In the von Neumann architecture, programs and data are held in memory, the processor and memory are separate and data moves between the two resulting in latency. The improvements in data processing circuits have made data processing faster, whereas the improvements in memory elements have focused on making memories denser rather than faster. In that configuration, latency is a prevalent problem, as is the increasing idle time for data processing circuits awaiting data from the memory elements. These problems are referred to as the limitations of von Neumann architecture.

New memory and access device combinations are being explored to overcome the limitations of von Neumann architecture. One of the potential candidates proposed by the illustrative embodiments to enable native neuromorphic computing (NNC) that includes a combination of phase change memory and an access device fabricated together as a semiconductor device unit. The illustrative embodiments recognize that such a combination device could enable compute-in-memory operations critical for native neuromorphic computing.

SUMMARY

The illustrative embodiments provide a method, system, and computer program product. An embodiment provides a semiconductor device that includes a first access structure formed from a mixed ionic electronic conduction (MIEC) material. The device further includes a first side of a first memory structure electrically coupled with a first side of the first access structure to form a combination device, wherein a subtractive etching process is applied to the combination device such that a surface of the combination device that is substantially orthogonal to a plane of a substrate of the semiconductor device is within a defined tapering tolerance.

An embodiment includes a method of fabricating the semiconductor device.

An embodiment includes a fabrication system to fabricate the semiconductor device. The system includes one or more processors, one or more computer-readable memories, and one or more computer-readable storage devices, and program instructions stored on at least one of the one or more storage devices for execution by at least one of the one or more processors via at least one of the one or more memories.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
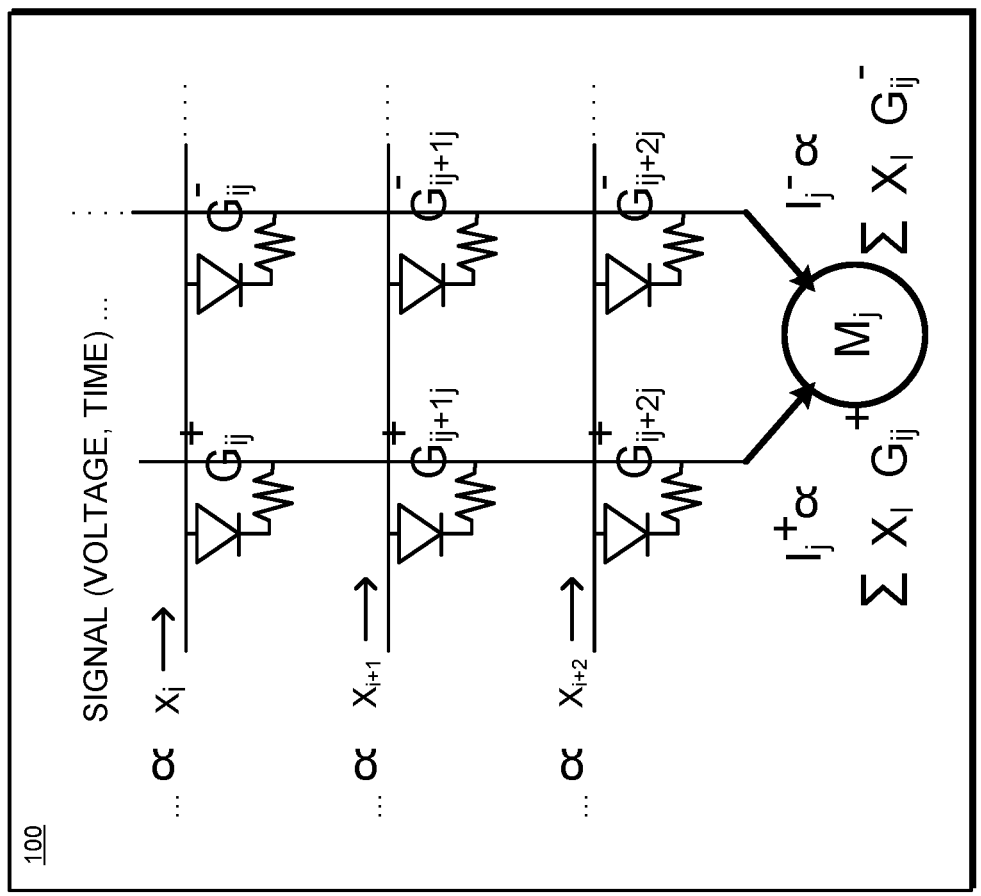
FIG. 1 depicts an example simple compute-in-memory circuit that is achieved by a combined structure according to an illustrative embodiment.

The illustrative embodiments recognize that patterning of a memory element and an AD element in a single patterning process is a difficult problem to solve. Such a patterning process is one of the critical enabling technologies for NNC. Therefore, a need exists for a fabricating process to fabricate a combined memory and AD device.

The illustrative embodiments further recognize that in the case of PCM, the SET operation is gradual but the RESET operation is abrupt thus each device node for NNC requires not one but two (memory+AD) combination structures. Therefore, an ability to pattern memory (e.g. a PCM device) and AD (e.g., a mixed ionic and electronic conduction (MIEC) device) structure together in a single etch process has distinct advantages. Therefore, a need exists for a fabricating process to fabricate two or more combined memory and AD devices simultaneously in a single fabrication process.

The illustrative embodiments used to describe the invention generally address and solve the above-described needs and other problems related to fabricating an access device and phase-change memory combination structure. The illustrative embodiments provide a fabrication method for access device and phase-change memory combination structure.

An embodiment comprises a semiconductor device described herein. Another embodiment comprises a fabrication process for the contemplated semiconductor device and can be implemented as a software application. The software application implementing an embodiment can be configured as a modification of an existing semiconductor fabrication system—such as a photolithography system, as a separate application that operates in conjunction with an existing semiconductor fabrication system, a standalone application, or some combination thereof. For example, the application causes the semiconductor fabrication system to perform the steps described herein, to fabricate an access device and phase-change memory combination structure, as described herein.

For the clarity of the description, and without implying any limitation thereto, the illustrative embodiments are described using a specific type of memory element (PCM) and a specific type of AD element (MIEC). Within the scope of the illustrative embodiments, an embodiment can be implemented with a variety of similarly purposed elements, where such elements pose similar fabrication problems as are recognized with PCM and MIEC.

Furthermore, simplified diagrams of the example structures, elements, and device(s) are used in the figures and the illustrative embodiments. In an actual fabrication of a proposed device, additional structures that are not shown or described herein, or structures different from those shown and described herein, may be present without departing the scope of the illustrative embodiments. Similarly, within the scope of the illustrative embodiments, a shown or described structure in the example device may be fabricated differently to yield a similar operation or result as described herein.

Differently shaded portions in the two-dimensional drawing of the example structures, layers, and formations are intended to represent different structures, layers, and formations in the example fabrication, as described herein. The different structures, layers, and formations may be fabricated using suitable materials that are known to those of ordinary skill in the art as belonging to the same class of materials described herein.

A specific shape, location, position, or dimension of a shape depicted herein is not intended to be limiting on the illustrative embodiments unless such a characteristic is expressly described as a feature of an embodiment. The shape, location, position, dimension, or some combination thereof, are chosen only for the clarity of the drawings and the description and may have been exaggerated, minimized, or otherwise changed from actual shape, location, position, or dimension that might be used in actual photolithography to achieve an objective according to the illustrative embodiments.

Furthermore, the illustrative embodiments are described with respect to a specific actual or hypothetical semiconductor device only as an example. The steps described by the various illustrative embodiments can be adapted for fabricating a variety of planar and non-planar devices in a similar manner, and such adaptations are contemplated within the scope of the illustrative embodiments. The specific electrodes placements are also used only as non-limiting examples to describe certain options possible with the illustrative embodiments. Those of ordinary skill in the art will be able to use an embodiment to similarly provide electrical access to a layer or structure in a similar manner, and such usage is also contemplated within the scope of the illustrative embodiments.

An embodiment when implemented in an application causes a fabrication process to perform certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

A device of an embodiment described herein, comprises substantial advancement of the compute-in-memory capability that is needed for the advancement of computing technologies, including but not limited to neuro-morphic computing. A manner of patterning a PCM type memory element and an MIEC type AD element as described herein is unavailable in the presently available methods. Thus, a substantial advancement of such devices or data processing systems by executing a method of an embodiment is in an improved fabrication process for fabricating a combined memory and AD device in a single process step.

The illustrative embodiments are described with respect to certain types of devices, electrical properties, structures, formations, layers, orientations, directions, steps, operations, planes, materials, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures.

The examples in this disclosure are used only for the clarity of the description and are not limiting to the illustrative embodiments. Additional structures, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

With reference to FIG. 1, this figure depicts an example simple compute-in-memory circuit that is achieved by a combined structure according to an illustrative embodiment. A MIEC AD structure described herein operates as a diode depicted in circuit 100. Memory module Mj is a memory element described with respect to a combined structure of the illustrative embodiments. Mj can be formed using PCM or other type of memory element, e.g., CBRAM.

The simplified circuit depicted in circuit 100 is not intended to be limiting on the types of combined structures that can be formed using an embodiment. Those of ordinary skill in the art will be able to adapt an example device described herein—which achieves the simple circuit 100 of this figure—to form more complex circuits in a similar manner using the described structure. Such adaptations are contemplated within the scope of the illustrative embodiments.

Figure 2:
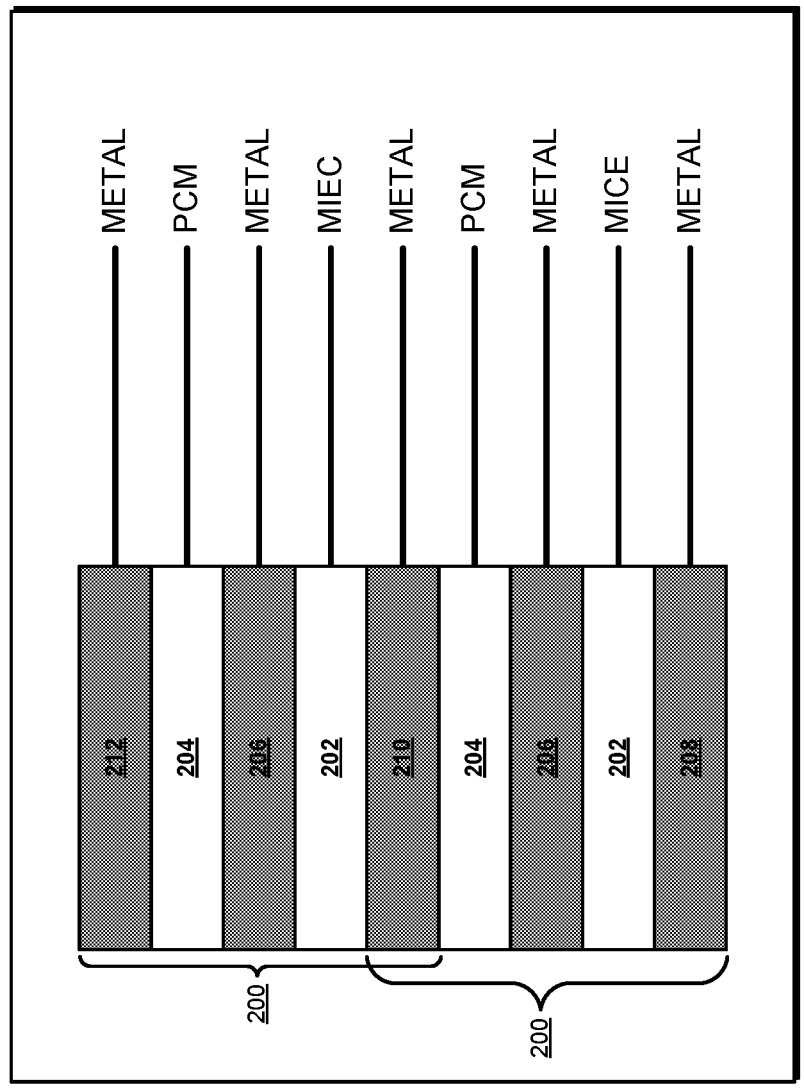
FIG. 2 depicts one example configuration in which two combined structures are stacked, each combining a memory and an AD structures in accordance with an illustrative embodiment.

With reference to FIG. 2, this figure depicts one example configuration in which two combined structures are stacked, each combining a memory and an AD structures in accordance with an illustrative embodiment.

A combination of one AD structure, e.g., one MIEC layer 202, and one memory element structure, e.g., one PCM layer 204 forms combined structure 200—a building block—according to an embodiment. Any number of such combinations can be stacked in the manner depicted in FIG. 2.

A distinctive feature of each combined structure 200 according to the illustrative embodiments is that MIEC layer 202 in any instance of combined structure 200 is substantially non-tapering from the bottom to the top of said layer 202. Stated another way, the sides of layer 202 other than the sides of layer 202 shown contacting metal layers are substantially perpendicular relative to the plane of the contact with the metal layers. Patterning MIEC layers with substantially vertical walls is a difficult problem, and is achieved by a process described herein to fabricate combined structure 200.

The building block combined structure 200 can include one or more suitable layers or structures intervening between structures 202 and 204 to form an electrically conducting path between structures 202 and 204. Layer 206 is such a layer and is formed by depositing a suitable metal during the fabrication process.

Similarly, suitable conducting structures or layers may be formed on structures 202 and 204 to allow electrical connectivity to combined structure 200 from an external circuit. Layers 208, 210, and 212 depicted in FIG. 2 are examples of such conducting structures and may be formed by depositing the same or different conducting materials.

For example, layer 208 may be formed as a bottom electrode coupling to MIEC 202 and layer 210 may be formed as a top electrode coupling with PCM 204. Alternatively, layer 210 may be similar to layer 206 and couple PCM 204 with another instance of MIEC 202. Layer 212 may be formed as the top electrode in such a combination.

An instance of structure 208, 210, or 212 may be formed on any of the sides of structure 202 that are not facing towards, or otherwise connecting to, a side of structure 204 in a non-stacked configuration. An instance of structure 208, 210, or 212 may be formed on any of the sides of structure 204 that are not facing towards, or otherwise connecting to, a side of structure 202 in a non-stacked configuration.

Figure 3:
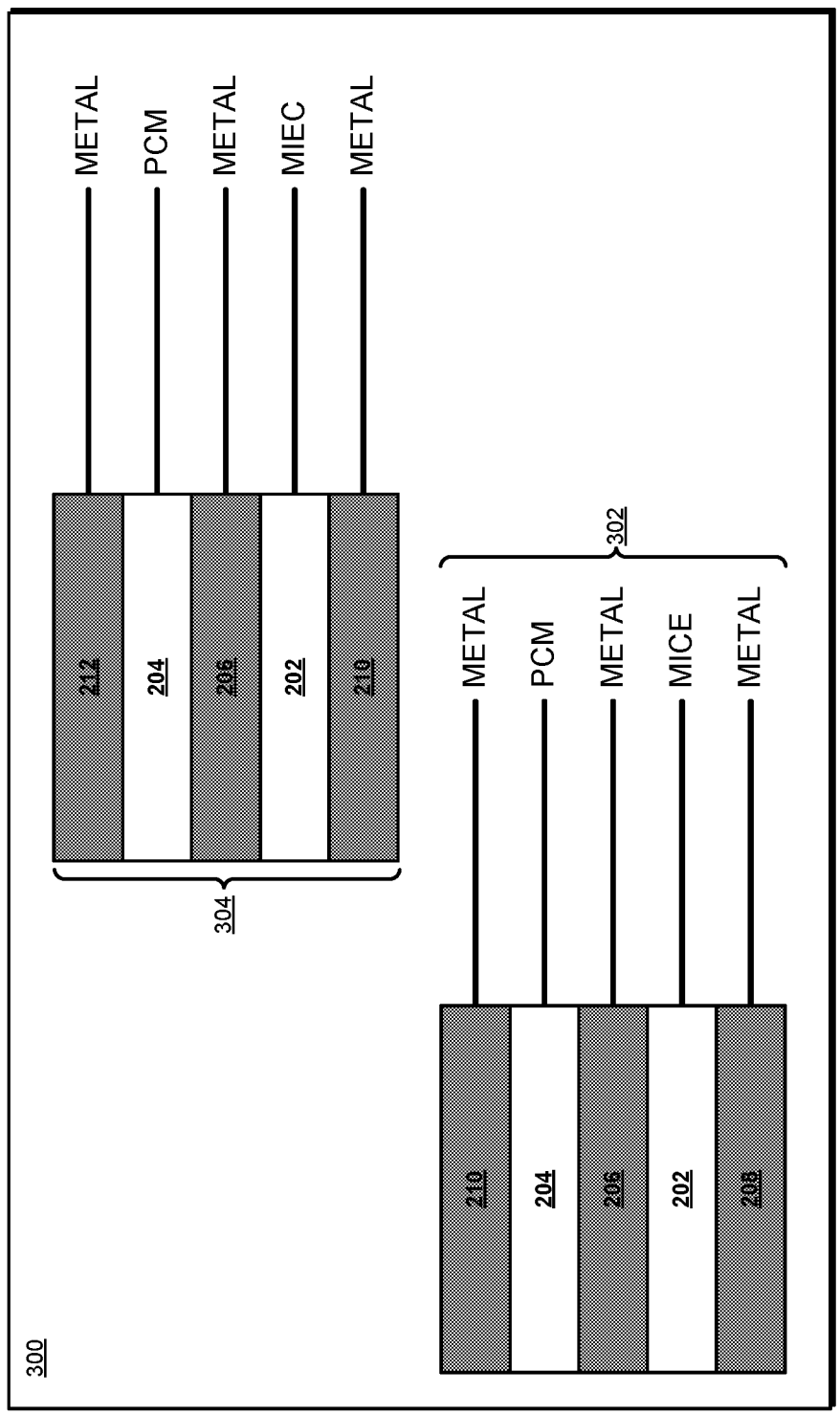
FIG. 3 depicts one example configuration in which two combined structures are fabricated separately in the same process, each combining a memory and an AD structures in accordance with an illustrative embodiment.

With reference to FIG. 3, this figure depicts one example configuration in which two combined structures are fabricated separately in the same process, each combining a memory and an AD structures in accordance with an illustrative embodiment. Each of structures 302 and 304 is similar to one instance of combined structure 200 in FIG. 2. In each of combined structures 302 and 304, structures 202, 204, 206, 208, 210, and 212 are fabricated and operate in a manner similar to the fabrication and operations of similarly numbered structures in FIG. 2.

For example, layer 208 may be formed as a bottom electrode coupling to MIEC 202 in combination device 302 and layer 210 may be formed as a top electrode coupling with PCM 204 in combination device 302. In device 304, layer 210 may be the bottom electrode of MIEC 202 in combination device 304. Layer 212 may be formed as the top electrode in combination device 304.

Without implying any limitation thereto, structures 302 and 304 may be fabricated in parallel on the same substrate. One reason to form parallel combined structures of FIG. 3 instead of stacked combined structure of FIG. 2 is to reduce capacitance between the layers of the combined structures. Another reason is to reduce aspect ratio of the pillar to be etched.

Figure 4:
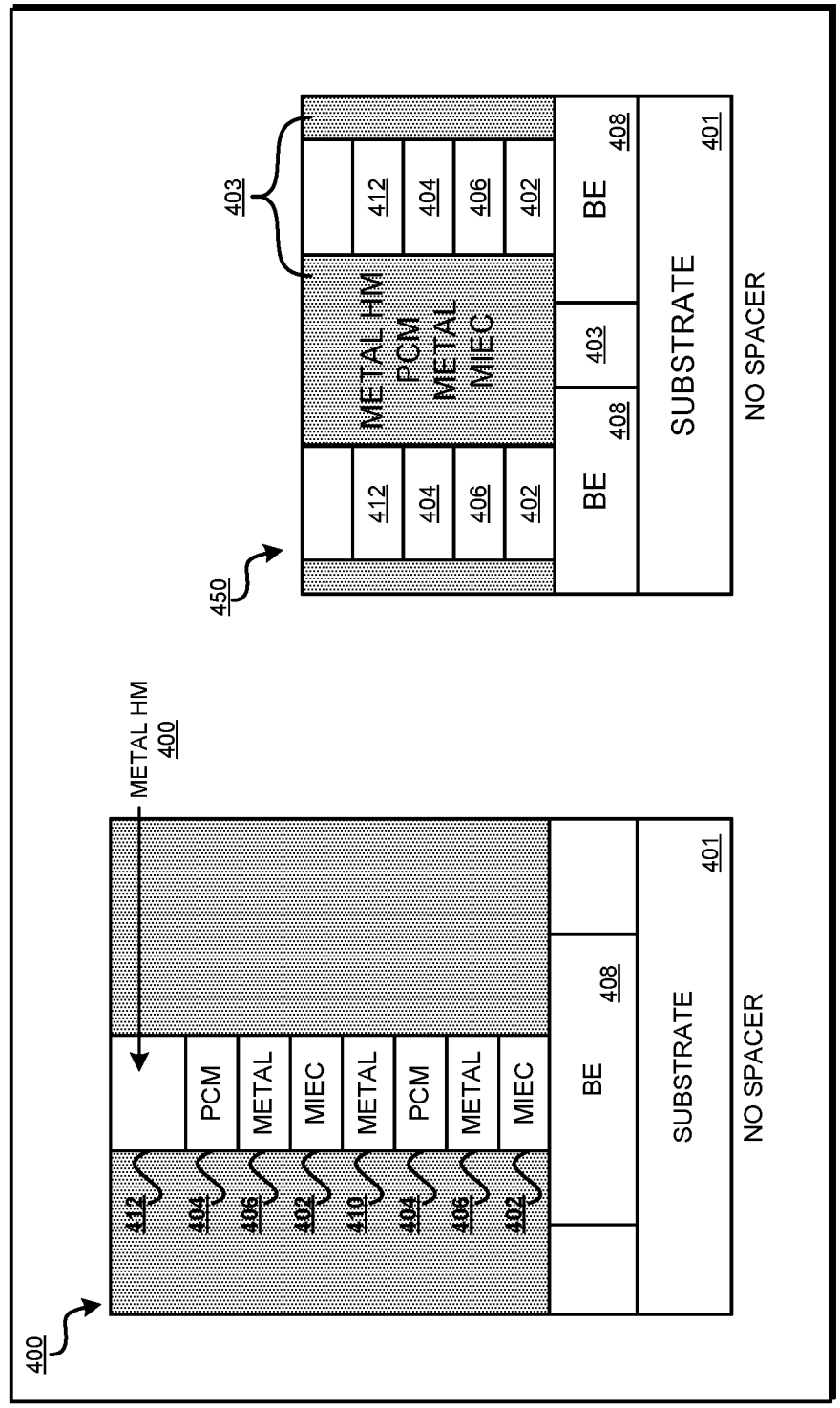
FIG. 4 depicts a view of the combined structure resulting from one variation of a subtractive etching process of fabrication where the etching is performed without spacers in accordance with an illustrative embodiment.

With reference to FIG. 4, this figure depicts a view of the combined structure resulting from one variation of a subtractive etching process of fabrication where the etching is performed without spacers in accordance with an illustrative embodiment. Stacked combination device 400 corresponds to stacked combination device 200 instances depicted in FIG. 2. Parallel combination devices 450 corresponds to combination device 302 and 304 instances depicted in FIG. 3.

Note that the entire stacked combination device 400 and each parallel combination device in 450 has walls or vertical surfaces that are substantially perpendicular to the plane of substrate 401. These vertical surfaces include vertical surfaces of MIEC layers 402, which are also formed in substantially vertical manner using one form of subtractive etching process according to an embodiment. In this form of subtractive etching, no spacer material is needed as the layers are progressively etched from top metal hard mask (HM) layer 412 up to but not including bottom electrode layer 408.

In function, form, and materials, layer 402 corresponds to layer 202, layer 404 corresponds to layer 204, layer 406 corresponds to layer 206, layer 408 corresponds to layer 208, layer 410 corresponds to layer 210, and layer 412 corresponds to layer 212. Substrate 401 is of any suitable substrate material, commonly but not necessarily Silicon (Si). Dielectric 403 is any suitable dielectric material, such as including but not limited to silicon oxide (SiO2 or "oxide").

Figure 5:
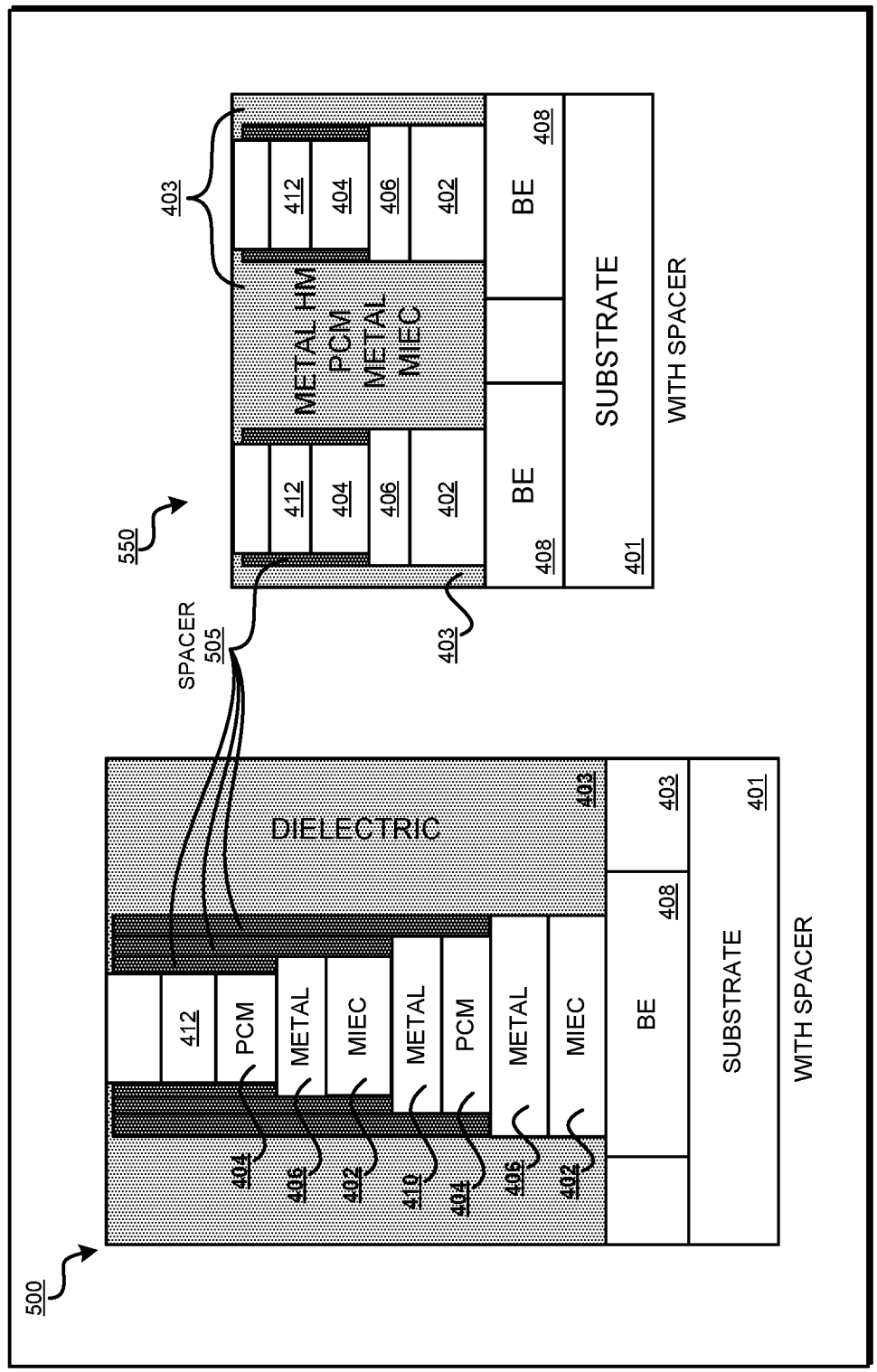
FIG. 5 depicts a view of the combined structure resulting from another variation of a subtractive etching process of fabrication where the etching uses spacers in accordance with an illustrative embodiment.

With reference to FIG. 5, this figure depicts a view of the combined structure resulting from another variation of a subtractive etching process of fabrication where the etching uses spacers in accordance with an illustrative embodiment. Stacked combination device 500 corresponds to stacked combination device 200 instances depicted in FIG. 2. Parallel combination devices 550 corresponds to combination device 302 and 304 instances depicted in FIG. 3.

Note again that the entire stacked combination device 500 and each parallel combination device in 550 has walls or vertical surfaces that are substantially perpendicular to the plane of substrate 401. These vertical surfaces include vertical surfaces of MIEC layers 402, which are also formed in substantially vertical manner using one form of subtractive etching process according to an embodiment.

In this form of subtractive etching, spacer 505 material is deposited in a stepped manner as the layers are progressively etched from top metal hard mask (HM) layer 412 up to but not including bottom electrode layer 408. Spacer 505 can be formed using any suitable insulator material known to be used for creating an etching resistant barrier. Additional layers may exist above the metal HM layer 412, e.g., a photo-resist (PR) layer, an anti-reflective coating (ARC), and/or an optical planarizing layer (OPL).

Figure 6:
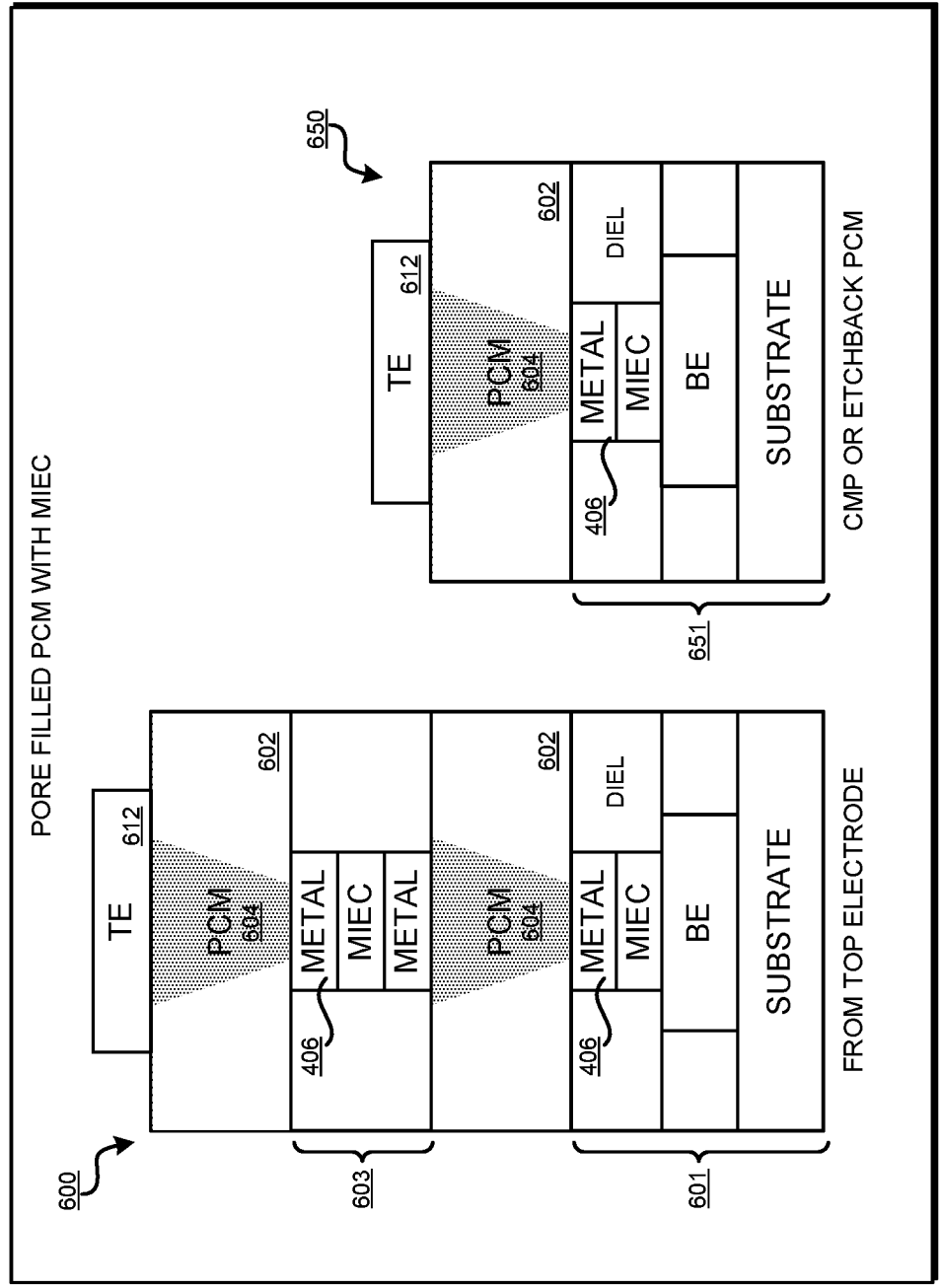
FIG. 6 depicts a view of the combined structure resulting from a pore filling process of fabrication in accordance with an illustrative embodiment.

With reference to FIG. 6, this figure depicts a view of the combined structure resulting from a pore filling process of fabrication in accordance with an illustrative embodiment. Any etching of any layer in combination device 600 or 650 can be performed with or without spacers as described in FIGS. 4 and 5.

Stacked combination device 600 corresponds to stacked combination device 200 instances depicted in FIG. 2. combination device 650 corresponds to any one of parallel combination devices 302 and 304 depicted in FIG. 3.

Portion 601 can be formed in a manner of a corresponding portion in FIG. 4 or FIG. 5. For example, the layers in portion 601 can be patterned using a combination of lithography, reactive ion etching (RIE), dielectric filling, and chemical-mechanical planarization (CMP) methods of fabrication.

With reference to stacked combination devices 600, dielectric 602 is deposited over metal 406 layer. Dielectric 602 may be the same as or different from dielectric 403. Pore 604 is formed in dielectric 602 using any suitable pore forming method known to those of ordinary skill in the art. Pore 604 is essentially a tapered hole reaching across the full depth of dielectric 602 and exposing metal 406 below dielectric 602. Pore 604 is filled with PCM material 404.

Portion 603 is formed over PCM-filled pore 604 in a manner of a corresponding portion in FIG. 4 or FIG. 5. The techniques usable to form portion 603 can be similar to the techniques used in forming portion 601.

Again, second instance of dielectric 602 is deposited over second instance of metal 406 layer. Second instance of pore 604 is formed in second instance of dielectric 602 using any suitable pore forming method known to those of ordinary skill in the art. Second instance of pore 604 is filled with PCM material 404.

Any number of combination devices can be stacked in this manner using pore filling method of fabrication of combination devices. Over the last stacked combination device, top electrode layer 612 is formed using any suitable fabrication method, including but not limited to deposition, patterning, or planting.

Cs 650 is essentially a single combination device where portion 651 corresponds to portion 601 of stacked combination devices 600. The techniques usable to form portion 651 can be similar to the techniques used in forming portion 601.

Dielectric 602 is deposited over metal 406, pore 604 is formed, and PCM material 404 is filled in pore 604 in a similar manner as in stacked combination devices 600. Top electrode 612 is formed over PCM-filled pore 604.

Figure 7:
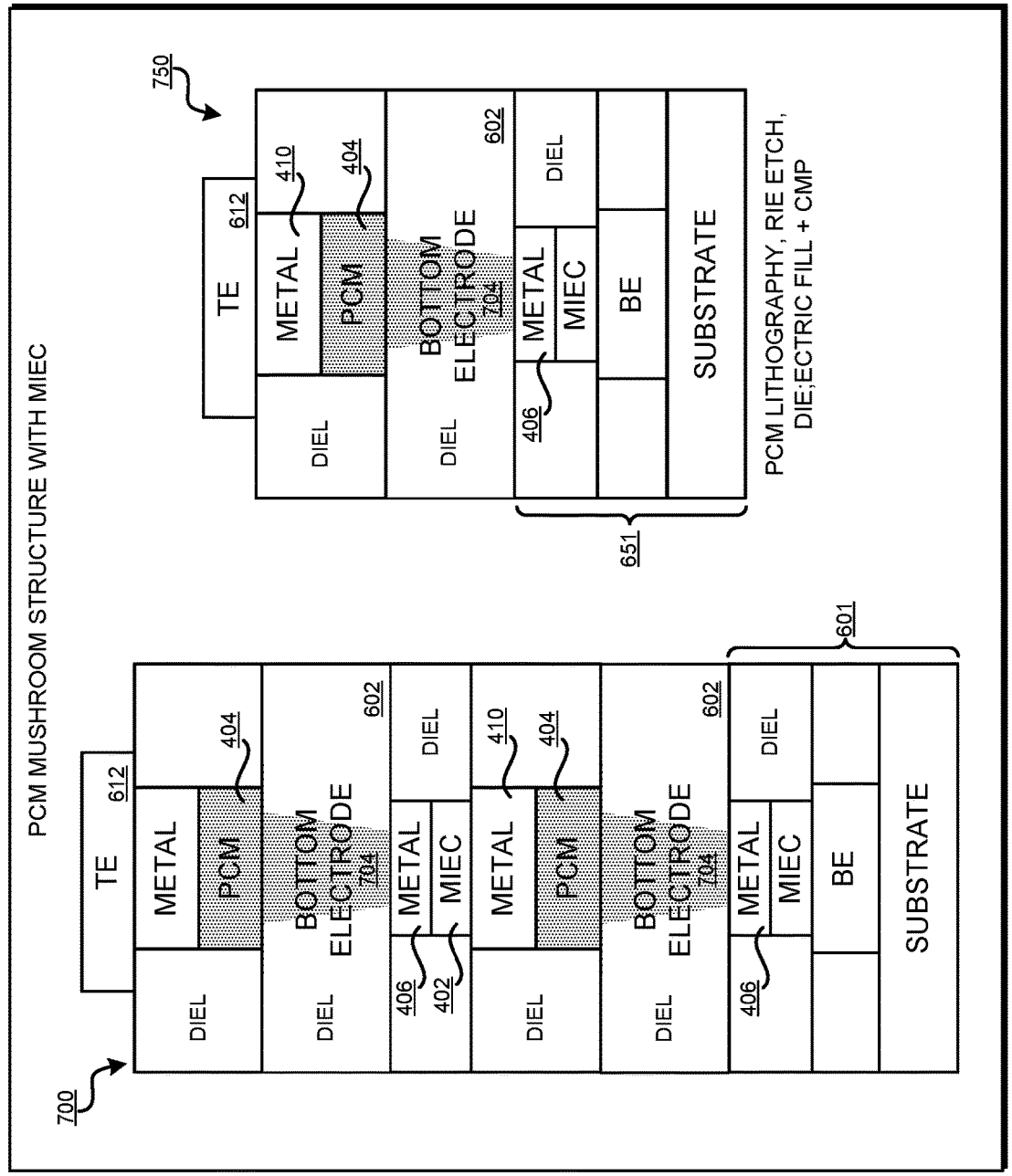
FIG. 7 depicts a view of the combined structure resulting from a mushroom process of fabrication in accordance with an illustrative embodiment.

With reference to FIG. 7, this figure depicts a view of the combined structure resulting from a mushroom process of fabrication in accordance with an illustrative embodiment. Any etching of any layer in combination device 700 or 750 can be performed with or without spacers as described in FIGS. 4 and 5.

Stacked combination device 700 corresponds to stacked combination device 200 instances depicted in FIG. 2. combination device 750 corresponds to any one of parallel combination devices 302 and 304 depicted in FIG. 3.

With reference to stacked combination devices 700, dielectric 602 is deposited over metal 406 layer. Pore 704 is formed in dielectric 602 using any suitable pore forming method known to those of ordinary skill in the art. Pore 604 is filled with a conducting material, such as a metal, to form bottom electrode 704 of PCM 404. PCM 404 formed over bottom electrode 704 in this manner resembles a mushroom, hence the name of the process. Any number of combination devices can be stacked in this manner using mushroom PCM method of fabrication of combination devices.

The top of PCM 404 in any given combination device can be metalized with layer 410. Metal layer 410 may either couple with another MIEC layer 402, as in combination device 700 when additional combination devices are stacked above as in combination devices 700, or with top electrode 612 at the last stacked combination device in combination devices 700 or the single combination device as in 750.

Figure 8:
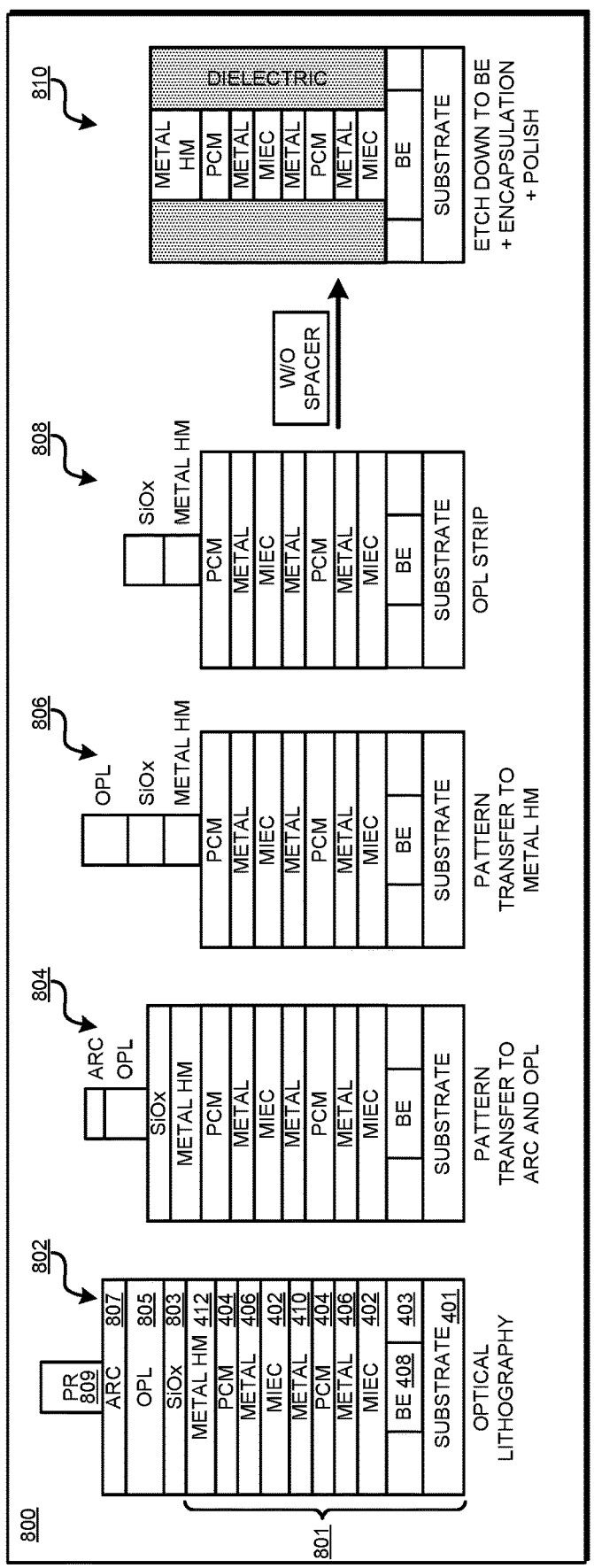
FIG. 8 depicts an example series of steps in a subtractive etching process according to an illustrative embodiment.

With reference to FIG. 8, this figure depicts an example series of steps in a subtractive etching process according to an illustrative embodiment. Assume that the objective is to form structure 400 of FIG. 4—a stacked combination device without spacers. At the beginning of process 800, suppose that layers 801 have been formed using a suitable method of fabrication. Layers 801 include substrate 401, bottom electrode 408, MIEC 402, metal 406, PCM 404, metal 410, MIEC 402, metal 406, PCM 404, and metal HM 412. Above layers 801, oxide layer 803, OPL 805, ARC 807 and PR layer 809 have been deposited.

The process begins at step 802 by patterning PR layer 809 into a shape. At step 804, the pattern is transferred to ARC 807 and OPL 805 layers, with PR layer 809 being removed (subtracted). The pattern transfer maintains the substantially vertical orientation of the side walls being formed at those layers.

At step 806, the lithography continues and the pattern is transferred to oxide 803 and metal HM 412, with ARC layer 807 being removed (subtracted). The pattern transfer maintains the substantially vertical orientation of the side walls being formed at those layers.

At step 808, OPL 805 is stripped (removed or subtracted). Thereafter, the lithography continues, oxide layer 803 is subtracted, and the same pattern is transferred in step 810 to subsequently lower layers until the etching reaches bottom electrode 408. The etched sides of the various layers above layer 408 are encapsulated in a dielectric material, e.g., dielectric 403. One or more of the horizontal surfaces of the encapsulated structure may also be polished.

Figure 9:
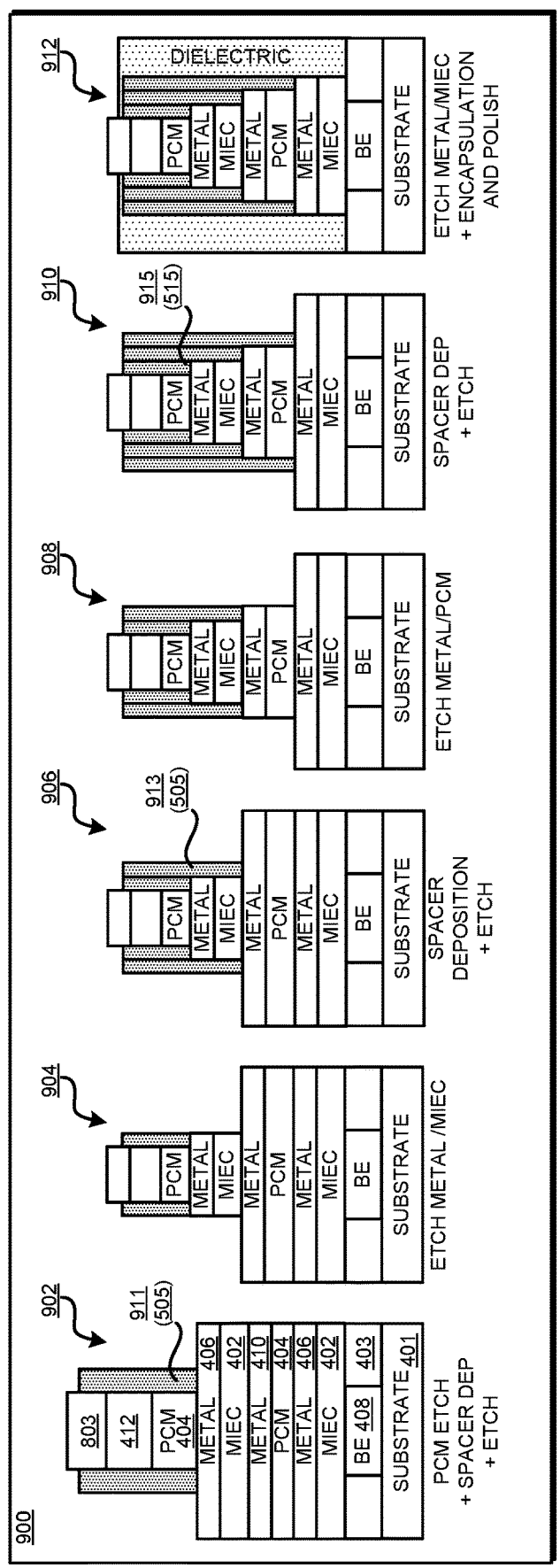
FIG. 9 depicts another example series of steps in a subtractive etching process according to an illustrative embodiment.

With reference to FIG. 9, this figure depicts another example series of steps in a subtractive etching process according to an illustrative embodiment. Assume that the objective is to form structure 500 of FIG. 5—a stacked combination device with spacers.

Process 900 begins after process 800 has formed layers 801 and performed steps 802, 804, and 806. Process 900 picks up after step 806 of FIG. 8.

At step 902, PCM 404 0below HM 412 is etched in the same pattern as HM 412 and oxide 803 above. A suitable spacer material 911 is deposited to protect the walls of HM 412 and PCM 404 exposed from the etching. Spacer 911 is a part of spacer 505 in FIG. 5. Adding spacer 911 changes the pattern for the layers below PCM 404.

At step 904, layers 406 and 402 below PCM 404 are etched according to the new pattern while maintaining substantially vertical etched walls at layers 406 and 402. At step 906, a suitable spacer material 913 is deposited to protect the walls of layers 406 and 402 exposed from the etching. Spacer 913 is another part of spacer 505 in FIG. 5. Adding spacer 913 further changes the pattern for the layers below MIEC layer 402.

At step 908, layers 410 and 404 below MIEC layer 402 are etched according to the new pattern while maintaining substantially vertical etched walls at layers 410 and 404. At step 910, a suitable spacer material 915 is deposited to protect the walls of layers 410 and 404 exposed from the etching. Spacer 915 is another part of spacer 505 in FIG. 5. Adding spacer 915 further changes the pattern for the layers below PCM layer 404.

At step 912, layers 406 and 402 below PCM layer 404 are etched according to the new pattern while maintaining substantially vertical etched walls at layers 406 and 402. If further stacked combination devices existed below layer 402 etched at step 912, another spacer would be deposited. Because in the depicted example, back electrode layer 408 has been reached by the etching of step 912, no further etching has to occur. Accordingly, no additional spacer is needed to protect the walls of layers 406 and 402 exposed from the etching of step 912. Thereafter, the etched sides of the various layers above layer 408 are encapsulated in a dielectric material, e.g., dielectric 403. One or more of the horizontal surfaces of the encapsulated structure may also be polished.

Figure 10:
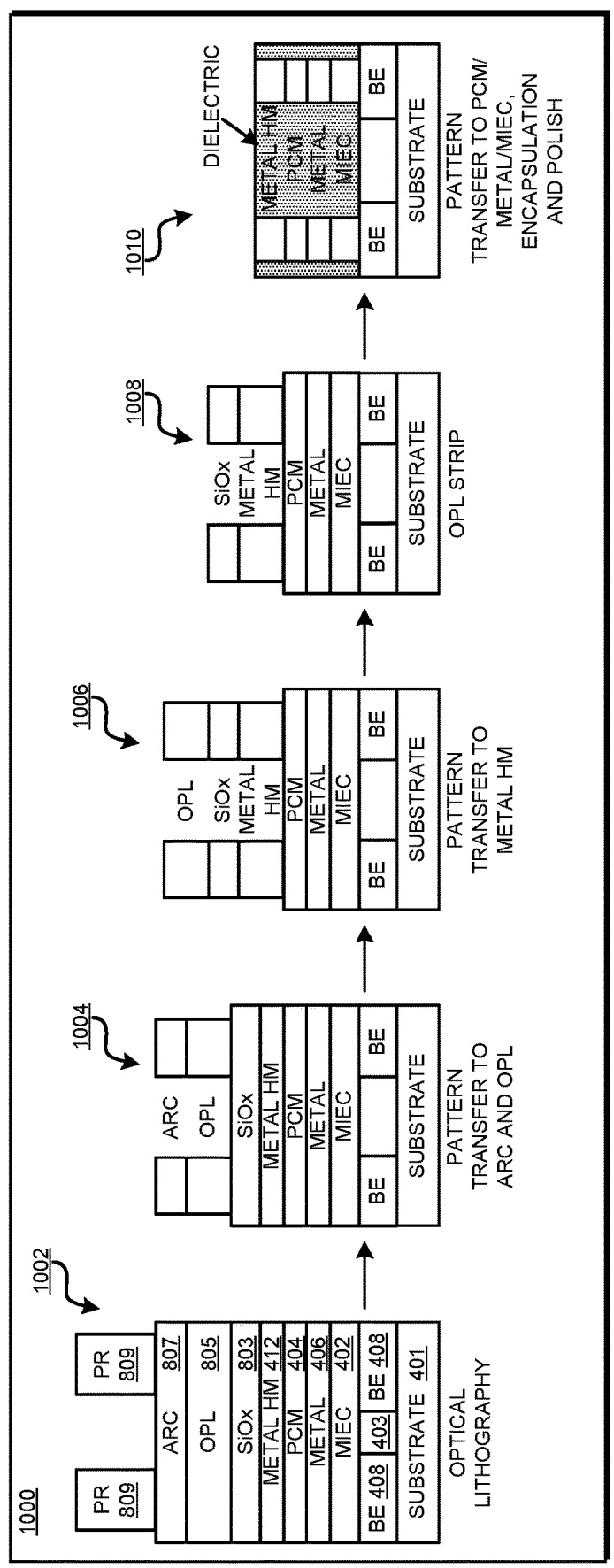
FIG. 10 depicts an example series of steps in a subtractive etching process according to an illustrative embodiment.

With reference to FIG. 10, this figure depicts an example series of steps in a subtractive etching process according to an illustrative embodiment. Assume that the objective is to form structure 450 of FIG. 4—parallel combination devices without spacers. Process 1000 progresses essentially as process 800 in FIG. 8, except that the patterning forms parallel structures with two or more PR layer structures 809 being formed as shown instead of a single PR layer structure 809 in FIG. 8.

Thereafter, step 1004 corresponds to step 804 albeit patterning multiple parallel vertical structures instead of a single stacked vertical structure. Layers 809, 807, 805, and 803 are subtracted as the pattern progresses downwards through the layers in substantially the manner of process 800. At step 1010, corresponding to step 810 in FIG. 8, dielectric 403 is filled not only around the parallel structures but also between the parallel structures as shown.

Figure 11:
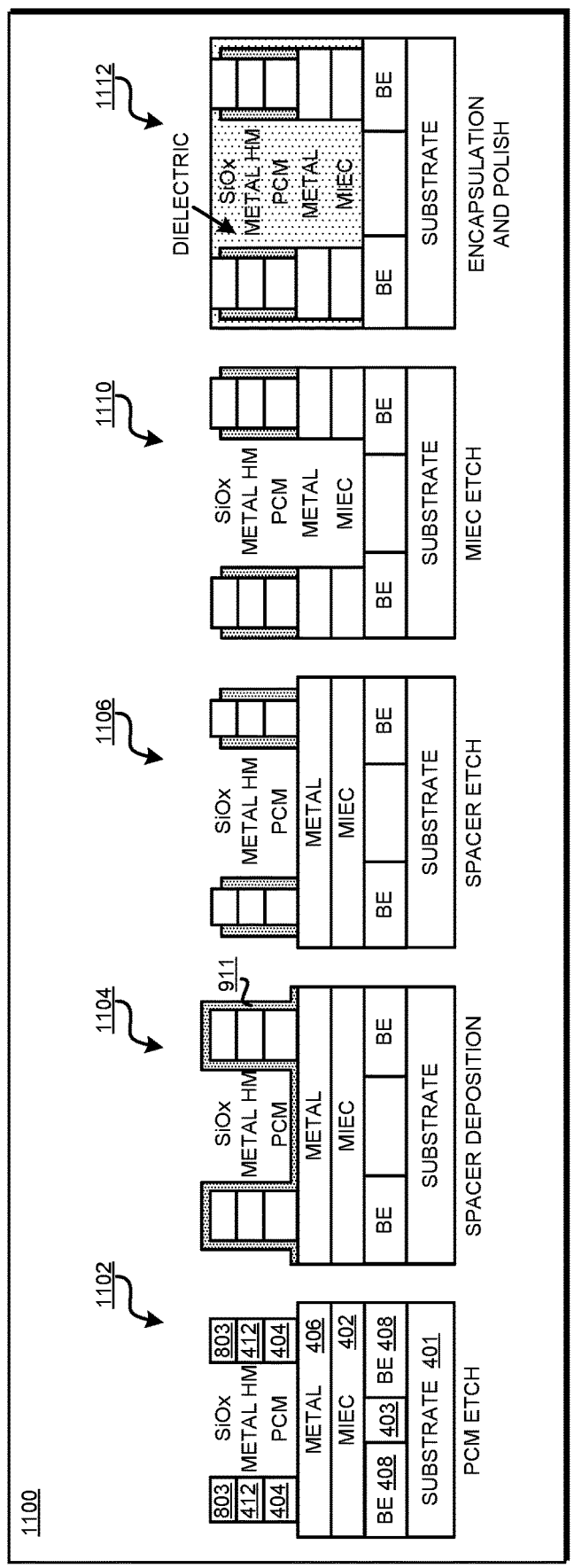
FIG. 11 depicts another example series of steps in a subtractive etching process according to an illustrative embodiment.

With reference to FIG. 11, this figure depicts another example series of steps in a subtractive etching process according to an illustrative embodiment. Assume that the objective is to form structure 550 of FIG. 5—parallel combination devices with spacers. Process 1100 progresses essentially as process 900 in FIG. 9, except that the patterning forms parallel structures with two or more oxide layer structures 803 being formed as shown instead of a single oxide layer structure 803 in FIG. 9.

Thereafter, step 1104 corresponds to step 904 albeit patterning multiple parallel vertical structures instead of a single stacked vertical structure. Step 1104 also deposits spacer 911 not only on the vertical walls but on all etched areas as shown. Step 1106 etches the spacer material from the horizontal areas atop the vertical structures and metal layer 406.

Step 1110 corresponds to step 910 in FIG. 9, where the bottommost metal layer 406 and MIEC layer 402 are etched before reaching back electrode layer 408 at each of the parallel structures. At step 1112, corresponding to step 912 in FIG. 9, dielectric 403 is filled not only around the parallel structures but also between the parallel structures as shown.

Figure 12:
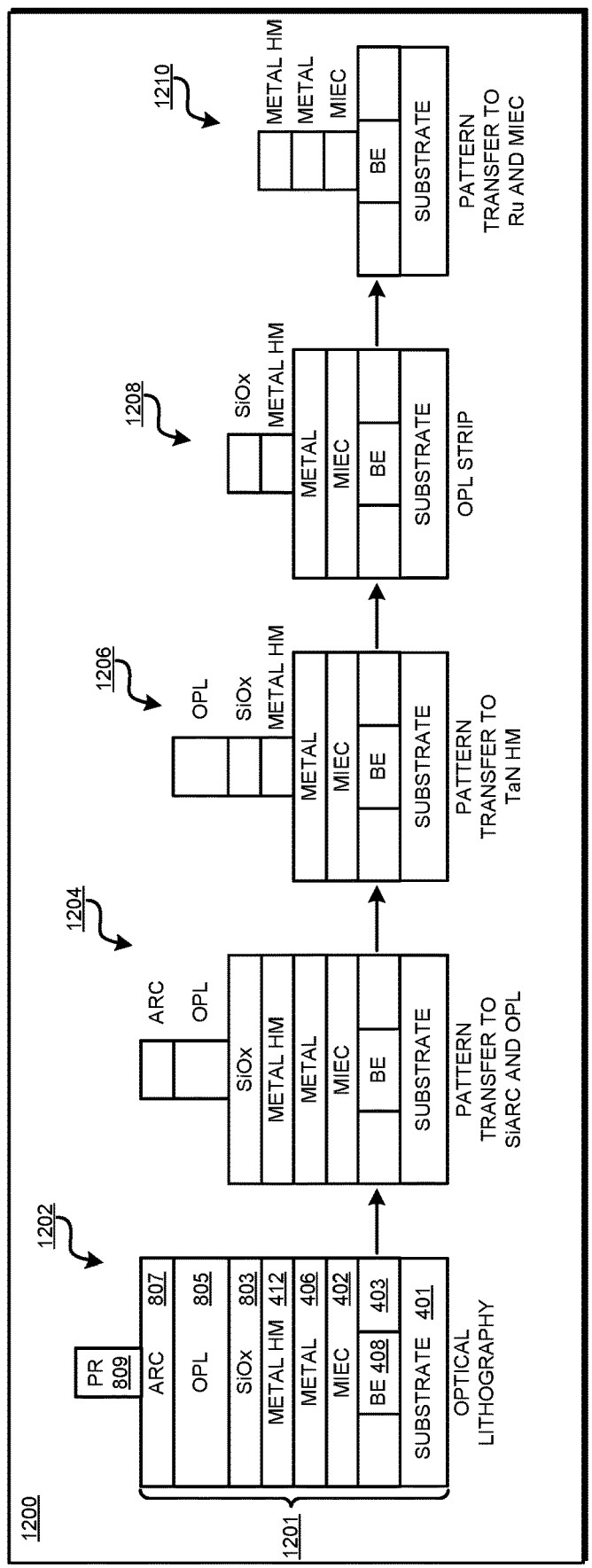
FIG. 12 depicts an example series of steps in a PCM-pore filling process according to an illustrative embodiment.

With reference to FIG. 12, this figure depicts an example series of steps in a PCM-pore filling process according to an illustrative embodiment. The fabrication of any of the combination devices described herein—stacked or parallel, with or without spacer, or some combination thereof—is possible with process 1200, assume that the objective is to form structure 400 of FIG. 4—a stacked combination device without spacers. At the beginning of process 1200, the process forms layers 1201 using a suitable method of fabrication. Layers 1201 include substrate 401, bottom electrode 408, MIEC 402, and metal 406. Above metal layer 406, oxide layer 803, OPL 805, ARC 807 and PR layer 809 have been deposited. The PCM layers are not yet formed, as they will be formed by pore filling in process 1200.

The process begins at step 1202 by patterning PR layer 809 into a shape, such as by using a suitable photolithography mask. At step 1204, the pattern is transferred to ARC 807 and OPL 805 layers, with PR layer 809 being removed (subtracted). The pattern transfer maintains the substantially vertical orientation of the side walls being formed at those layers.

At step 1206, the lithography continues and the pattern is transferred to oxide 803 and metal HM 412, with ARC layer 807 being removed (subtracted). The pattern transfer maintains the substantially vertical orientation of the side walls being formed at those layers.

At step 1208, OPL 805 is stripped (removed or subtracted). Thereafter, the lithography continues, oxide layer 803 is subtracted, and the same pattern is transferred in step 1210 to subsequently lower layers until the etching reaches bottom electrode 408. Process 1200 continues in FIG. 13.

Figure 13:
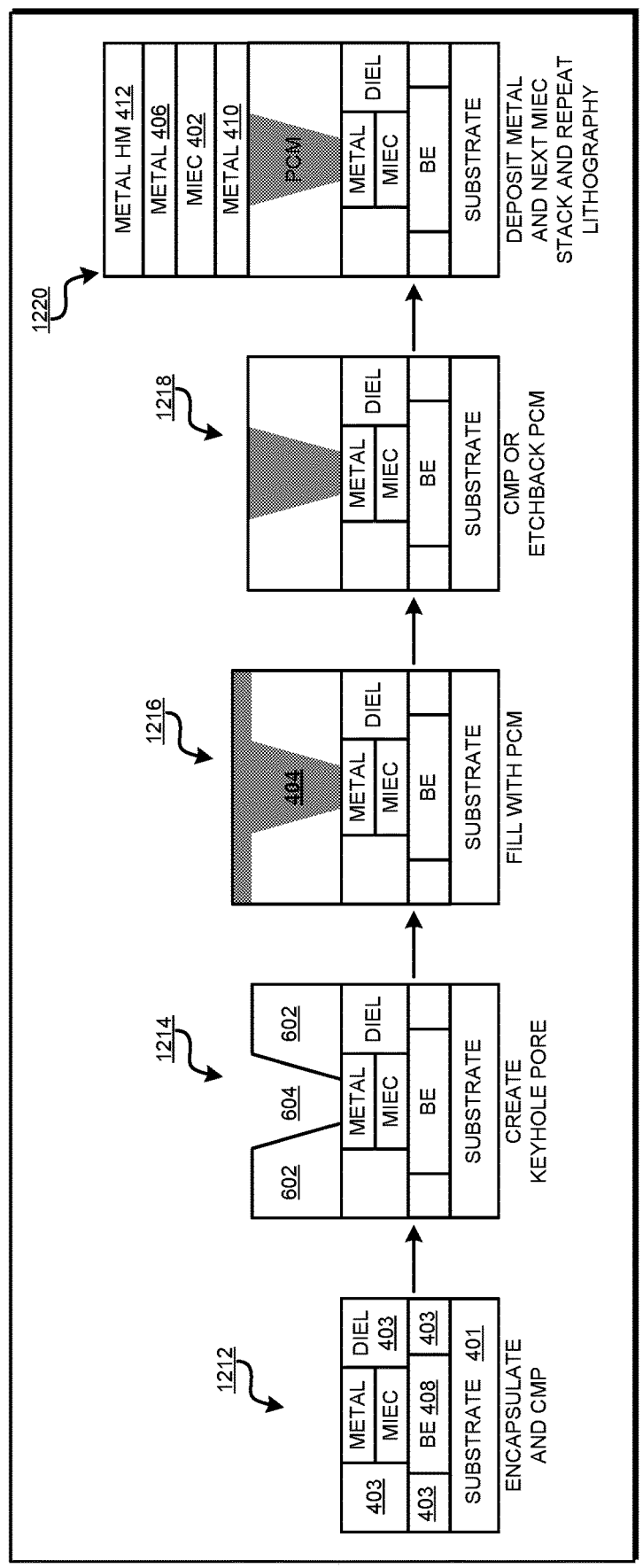
FIG. 13 depicts a continuation of process 1200 in accordance with an illustrative embodiment.

With reference to FIG. 13, this figure depicts a continuation of process 1200 in accordance with an illustrative embodiment. At step 1212, the etched sides of the various layers above layer 408 are encapsulated in a dielectric material, e.g., dielectric 403. One or more of the horizontal surfaces of the encapsulated structure may also be polished.

At step 1214, dielectric 602 is deposited above the encapsulated structure resulting from step 1212. In step 1214, pore 604 is formed in dielectric 602. At step 1216, pore 604 is filled with PCM material 404. As can be seen in step 1216, the fill is not exact and some PCM material 404 may remain above the top level of pore 604. Step 1218 performs CMP or otherwise etches back that PCM material 404 which is overflowing pore 604. PCM material 404 makes electrical contact with metal layer 406 below and is available to make electrical contact with a layer that will be deposited above in step 1220.

At step 1220, a set of layers for the next stacked combination device are deposited above PCM-filled pore 604. The set of layers includes metal layer 410, MIEC layer 402, metal layer 406, and metal HM 412. Process 1200 continues in FIG. 14.

Figure 14:
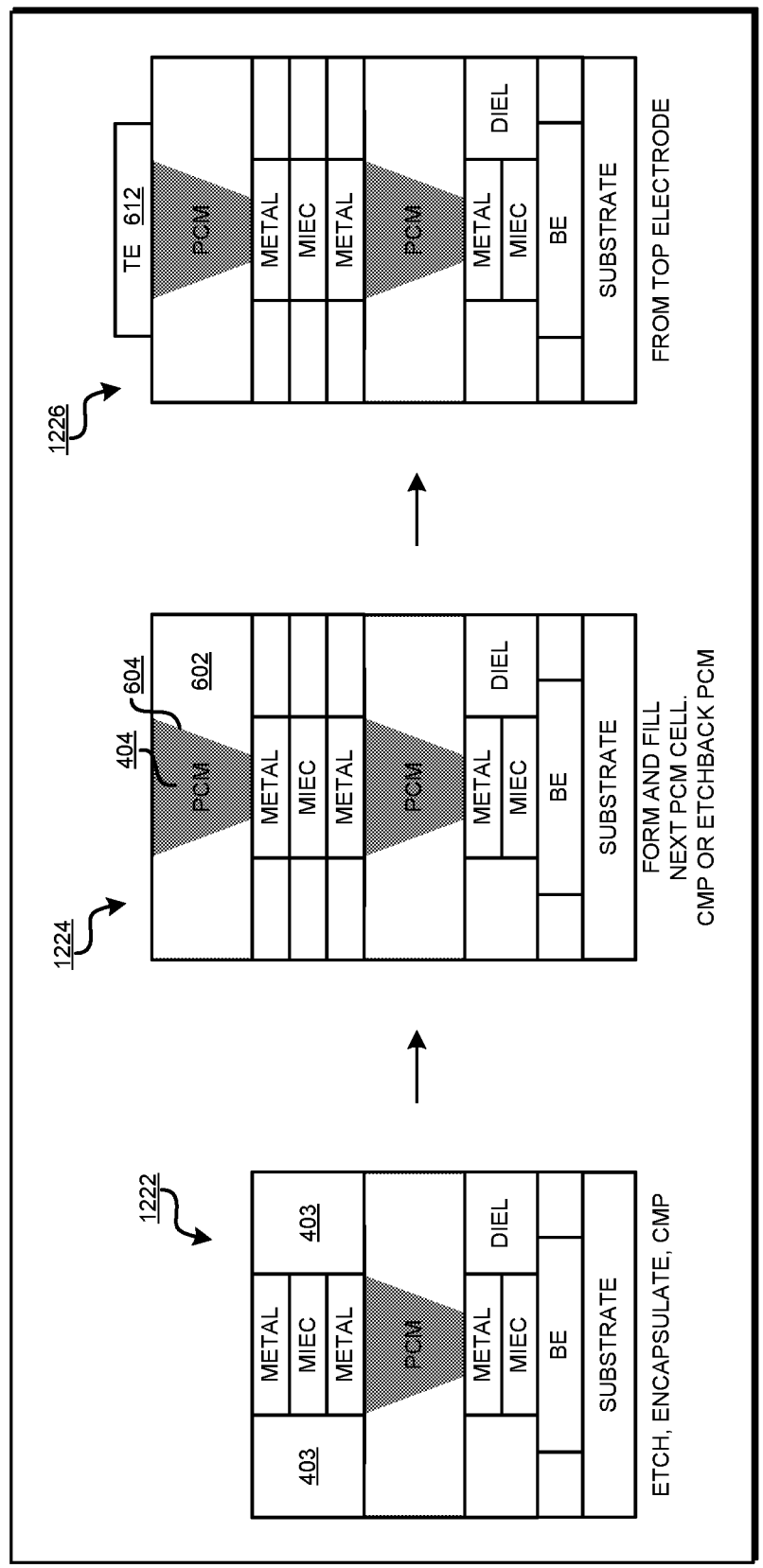
FIG. 14 depicts a continuation of process 1200 in accordance with an illustrative embodiment.

With reference to FIG. 14, this figure depicts a continuation of process 1200 in accordance with an illustrative embodiment. At step 1222, HM layer 412 is etched. Layers 406, 402, and 410 below HM 412 are subtractively etched as described herein. The etched sides of the various layers above PCM-filled pore 604 are encapsulated in a dielectric material, e.g., dielectric 403. One or more of the vertical surfaces of the encapsulated stacked structure may also be polished.

At step 1224, dielectric 602 is deposited above the stacked encapsulated structure resulting from step 1222. In step 1224, pore 604 is formed in dielectric 602. Pore 604 is filled with PCM material 404. CMP or other etchback process is performed to remote that PCM material 404 which is overflowing pore 604. PCM material 404 makes electrical contact with metal layer 406 below and is available to make electrical contact with a layer that will be deposited above in step 1226. Assuming that no more combination devices are to be stacked above, PCM-filled pore 604 can now be capped with top electrode 612.

Figure 15:
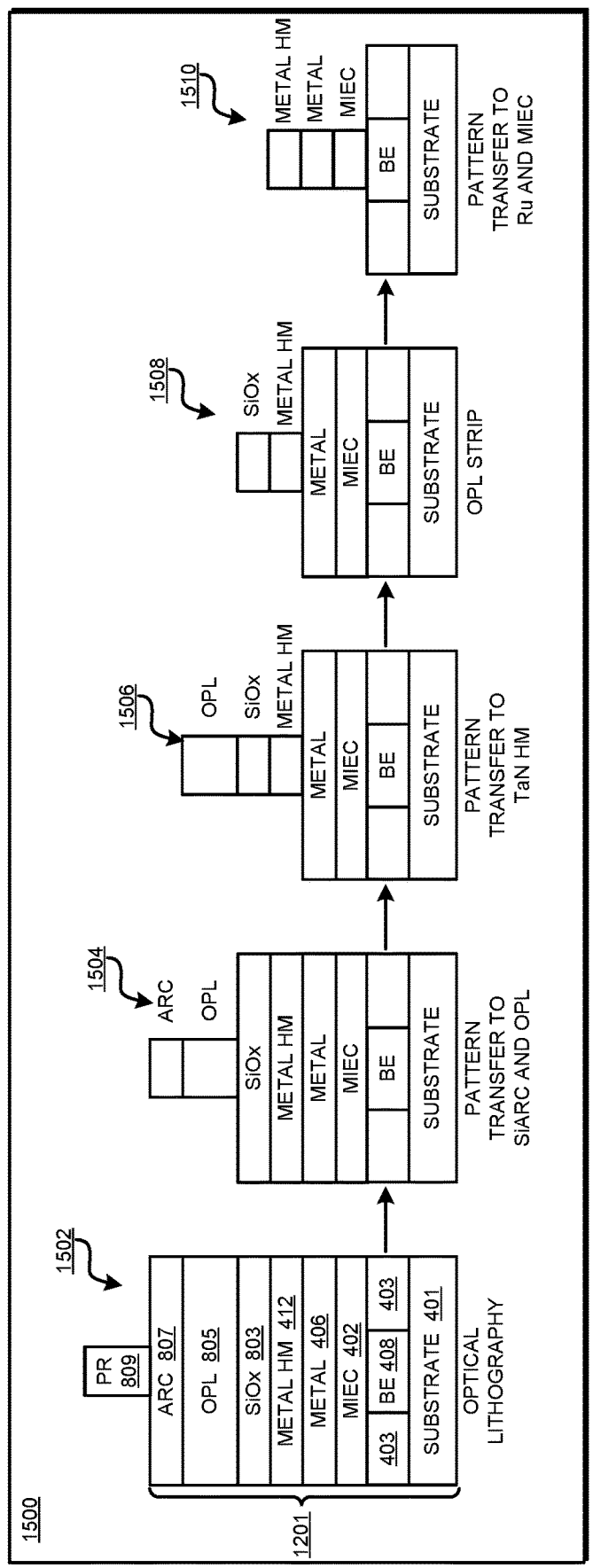
FIG. 15 depicts an example series of steps in a PCM mushroom process according to an illustrative embodiment.

With reference to FIG. 15, this figure depicts an example series of steps in a PCM mushroom process according to an illustrative embodiment. The fabrication of any of the combination devices described herein—stacked or parallel, with or without spacer, or some combination thereof—is possible with process 1200, assume that the objective is to form structure 400 of FIG. 4—a stacked combination device without spacers. At the beginning of process 1500, the process forms layers 1201, as in FIG. 12, using a suitable method of fabrication. Layers 1201 include substrate 401, bottom electrode 408, MIEC 402, and metal 406. Above metal layer 406, oxide layer 803, OPL 805, ARC 807 and PR layer 809 have been deposited. The PCM layers are not yet formed, as they will be formed by pore filling and mushrooming in process 1500.

The process begins at step 1502 by patterning PR layer 809 into a shape, such as by using a suitable photolithography mask. At step 1504, the pattern is transferred to ARC 807 and OPL 805 layers, with PR layer 809 being removed (subtracted). The pattern transfer maintains the substantially vertical orientation of the side walls being formed at those layers.

At step 1506, the lithography continues and the pattern is transferred to oxide 803 and metal HM 412, with ARC layer 807 being removed (subtracted). The pattern transfer maintains the substantially vertical orientation of the side walls being formed at those layers.

At step 1508, OPL 805 is stripped (removed or subtracted). Thereafter, the lithography continues, oxide layer 803 is subtracted, and the same pattern is transferred in step 1510 to subsequently lower layers until the etching reaches bottom electrode 408. Process 1500 continues in FIG. 13.

Figure 16:
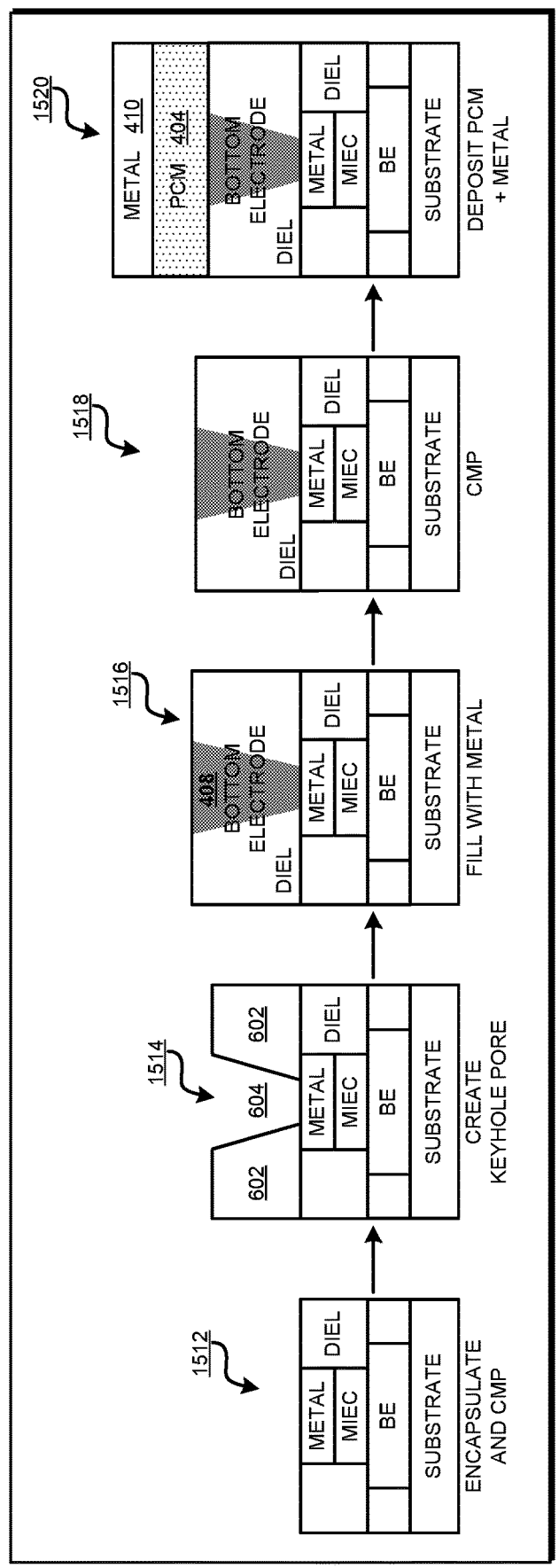
FIG. 16 depicts a continuation of process 1500 in accordance with an illustrative embodiment.

With reference to FIG. 16, this figure depicts a continuation of process 1500 in accordance with an illustrative embodiment. At step 1512, the etched sides of the various layers above layer 408 are encapsulated in a dielectric material, e.g., dielectric 403. One or more of the horizontal surfaces of the encapsulated structure may also be polished.

At step 1514, dielectric 602 is deposited above the encapsulated structure resulting from step 1512. In step 1514, pore 604 is formed in dielectric 602. At step 1516, pore 604 is filled with bottom electrode material 408. Note that a material different than material 408 may be used to fill pore 604 so long as the other material is suitable for forming an electrode. The fill may not be exact and some bottom electrode material 408 may remain above the top level of pore 604. Step 1518 performs CMP or otherwise etches back that bottom electrode material 408 which is overflowing pore 604. Bottom electrode material 408 makes electrical contact with metal layer 406 below and is available to make electrical contact with a layer that will be deposited above in step 1820.

At step 1520, PCM layer 404 is deposited over electrode material filled pore 604. Metal layer 410 is deposited above PCM layer 404. Bottom electrode material 408 in pore 604 thus forms the bottom electrode of mushroomed PCM 404. Process 1500 continues in FIG. 17.

Figure 17:
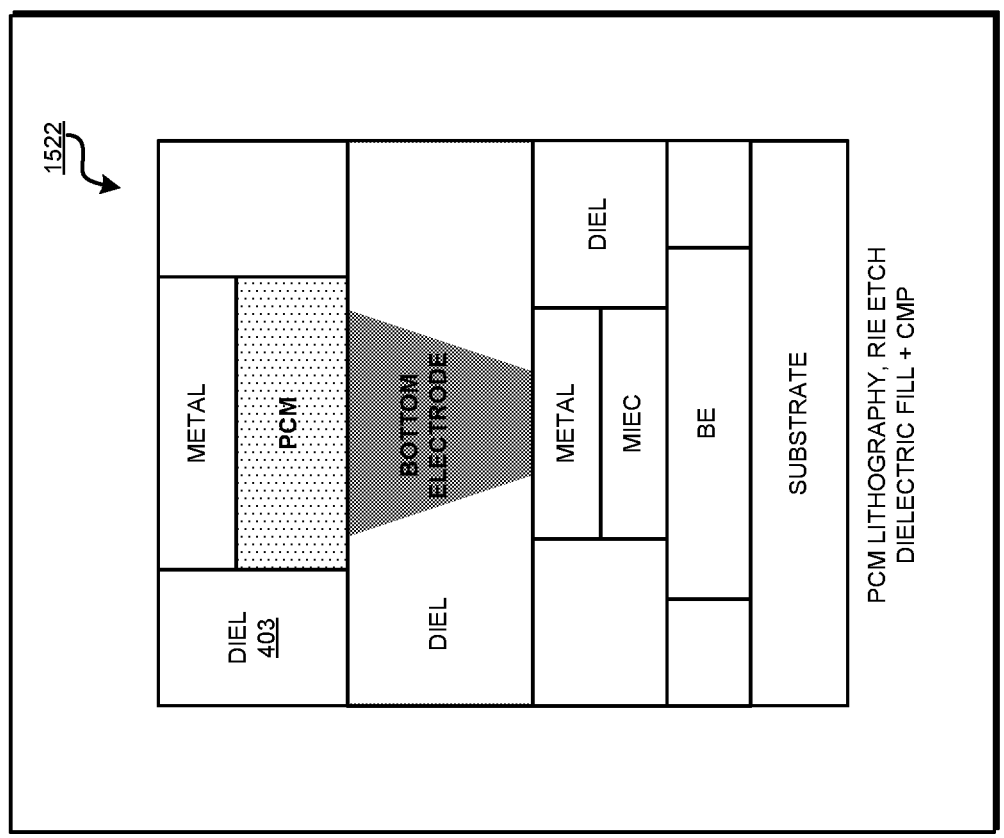
FIG. 17 depicts a continuation of process 1500 in accordance with an illustrative embodiment.
Figure 18:
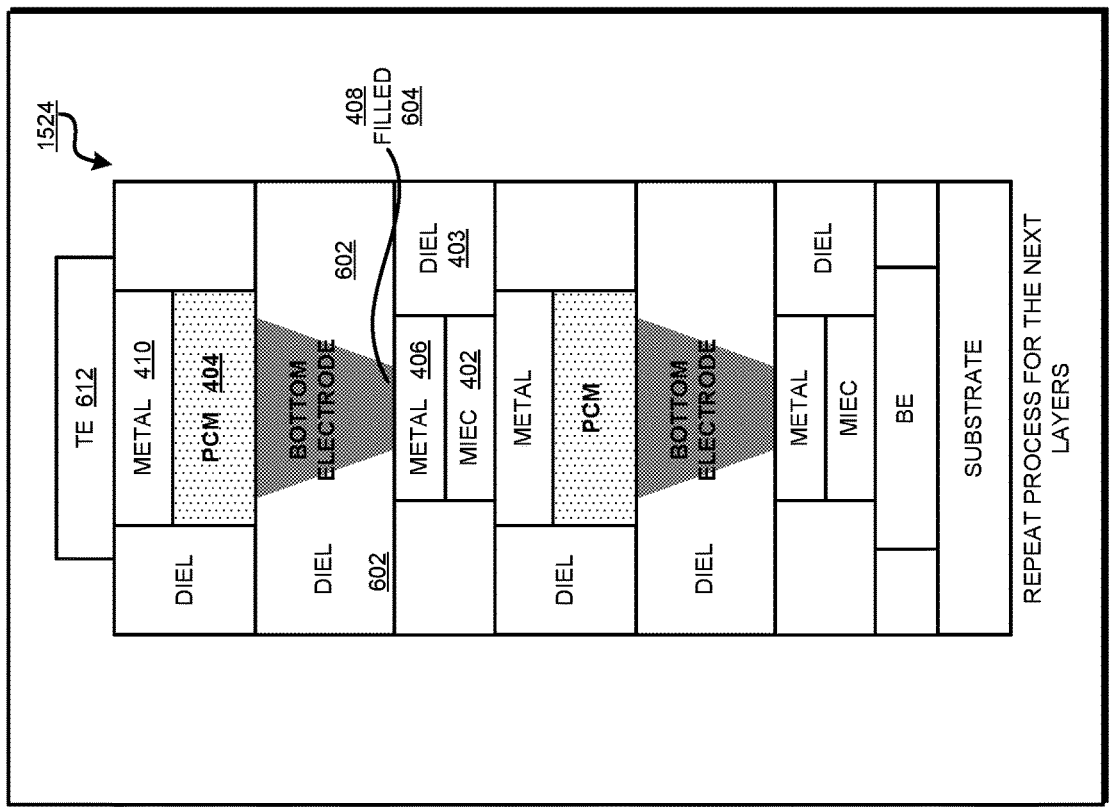
FIG. 18 depicts a continuation of process 1500 in accordance with an illustrative embodiment.

With reference to FIG. 17, this figure depicts a continuation of process 1500 in accordance with an illustrative embodiment. At step 1522, metal layer 410 and PCM 404 are etched. The etched sides of the various layers above filled pore 604 are encapsulated in a dielectric material, e.g., dielectric 403. One or more of the vertical surfaces of the encapsulated stacked structure may also be polished. The top of metal layer 410 may also be subjected to CMP to enable further deposition as shown in FIG. 18. Process 1500 continues in FIG. 18.

With reference to FIG. 18, this figure depicts a continuation of process 1500 in accordance with an illustrative embodiment. At step 1524, another stack of layers is deposited to form a stacked combination device above the encapsulated structure resulting from step 1522. MIEC layer 402, metal layer 406 are deposited above the encapsulated structure of step 1522, and etched, encapsulated, and polished as described herein. Dielectric 602 is deposited above resulting stacked encapsulated structure. Pore 604 is formed in dielectric 602. Pore 604 is filled with bottom electrode material 408 or another suitable electrode material. CMP or other etchback is performed to remove that electrode material 408 which is overflowing pore 604.

Electrode material 408 in pore 604 makes electrical contact with metal layer 406 below and is available to make electrical contact with a layer that will be deposited above.

PCM layer 404 is deposited over the stacked electrode material filled pore 604. Metal layer 410 is deposited above PCM layer 404. Layers 404 and 410 are subtractively etched, encapsulated, and polished as described herein. Bottom electrode material 408 in stacked pore 604 thus forms the bottom electrode of stacked mushroomed PCM 404. Assuming that no more combination devices are to be stacked above, top metal layer 410 can now be capped with top electrode 612.

While certain steps and processes are described with certain structures, it is to be understood that the steps and/or processes can be adapted to fabricate any of the structure variations described herein within the scope of the illustrative embodiments. While certain materials are used in multiple layers or structures, it is to be understood that substitute materials or different but functionally equivalent materials can be used in place of the described materials at any layers described herein within the scope of the illustrative embodiments. While certain fabrication methods have been used at certain steps, it is to be understood that a fabrication method may be omitted, added, or modified at a described step to achieve functionally similar result from the semiconductor structure within the scope of the illustrative embodiments. While certain operations are described as a "step," several operations can be combined together to form a single fabrication step in a process described herein. While orientations have been referred to as "top" and "bottom" with reference to an example vertical orientation of the proposed device, it is to be understood that the device can be reoriented laterally such that the top and bottom become left/right or right/left, or bottom and top, or front/back or back/front, as the reorientation case may be.

Thus, a semiconductor device, fabrication method therefor, and a fabrication system or apparatus therefor using a software implementation of the method, are provided in the illustrative embodiments for access device and phase-change memory combination structure and other related features, functions, or operations. Where an embodiment or a portion thereof is described with respect to a type of semiconductor device, the fabrication method, system or apparatus, the software implementation, or a portion thereof, are adaptable or configurable for use with a different manifestation of that type of device.

The present invention may be a semiconductor device, system, a method, and/or a computer program product at any possible technical detail level of integration. The computer program product may include a computer readable storage medium (or media) having computer readable program instructions thereon for causing a processor to carry out aspects of the present invention. A computer readable storage medium, including but not limited to computer-readable storage devices as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network.

What is claimed is:

1. A method comprising:
   forming, using a semiconductor fabrication system, a first access structure, wherein the forming comprises applying a first subtractive etching process to a mixed ionic electronic conduction (MIEC) material;
   forming, using the semiconductor fabrication system, a pore in a layer of dielectric material deposited over the first access structure, the forming of the pore comprising forming the layer of dielectric material to define a tapered portion of the pore, wherein the tapered portion defined by the layer of dielectric material has a cross-sectional area that increases with distance from the first access structure;
   forming, using the semiconductor fabrication system, a first electrode over the first access structure, wherein the forming comprises depositing electrode material in the tapered portion of the pore; and
   forming, using the semiconductor fabrication system, a first memory structure over the first electrode, the forming of the first memory structure comprising electrically coupling the first memory structure with the first access structure through the first electrode to form a combination device,
   wherein the applying of the first subtractive etching process to the MIEC material comprises etching such that the first access structure is substantially non-tapering from a bottom of said first access structure to a top of the first access structure, wherein the bottom and top of said first access structure are substantially parallel to a plane of a substrate of the semiconductor.

2. The method of claim 1, wherein the first subtractive etching process is a single step.

3. The method of claim 1, further comprising:
   forming a second electrode over the first memory structure, comprising electrically coupling the second electrode with the first memory structure.

4. The method of claim 1, further comprising:
   forming a pore in a dielectric material over the first access structure; and
   filling a Phase-Change memory (PCM) material in the pore to form the first memory structure, wherein the pore is configured to enable an electrical coupling between the first memory structure and the first access structure.

5. The method of claim 1, further comprising:
   forming the pore in the layer of dielectric material aligned with and over the first access structure; and
   filling the electrode material in the pore to form the first electrode, wherein the pore is configured to enable the electrical coupling between a first memory structure and the first access structure.

6. The method of claim 1, further comprising:
   forming a second access structure over the first memory structure, the second access structure comprising MIEC material formed over the first memory structure, wherein the first memory structure is electrically coupled with the second access structure; and
   electrically coupling a second memory structure with the second access structure.

7. The method of claim 6, further comprising:
   electrically coupling a second electrode with the second access structure; and
   electrically coupling the second electrode with the second memory structure.

8. The method of claim 1, wherein the forming of the first access structure comprises:
   depositing a plurality of access-structure layers over a surface of a substrate, the plurality of access-structure layers comprising an MIEC layer of the MIEC material; and
   patterning the plurality of access-structure layers to form the first access structure, the patterning comprising the first subtractive etching process that exposes a side wall of the first access structure that is substantially parallel to a direction normal to the surface of the substrate.

9. The method of claim 8, wherein the forming of the first memory structure comprises:
   depositing a memory material layer over the first electrode; and
   patterning the memory material layer to form the first memory structure, the patterning comprising a second subtractive etching process that exposes a side wall of the first memory structure that is substantially parallel to a direction normal to the surface of the substrate.

* * * * *